United States Patent [19]

Nishi

[11] Patent Number: 4,746,965
[45] Date of Patent: May 24, 1988

[54] INTEGRATED SEMICONDUCTOR CIRCUIT DEVICE

[75] Inventor: Hiroaki Nishi, Yokohama, Japan

[73] Assignee: Kabushiki Kaisha Toshiba, Saiwai, Japan

[21] Appl. No.: 799,093

[22] Filed: Nov. 18, 1985

[30] Foreign Application Priority Data

Mar. 29, 1985 [JP] Japan .................................. 60-63450

[51] Int. Cl.$^4$ ....................... H01L 23/48; H01L 29/52
[52] U.S. Cl. ......................................... 357/68; 357/71
[58] Field of Search ................... 357/45, 45 M, 68, 71, 357/65, 71 S, 71 P

[56] References Cited

U.S. PATENT DOCUMENTS

| | | | |
|---|---|---|---|
| 4,197,555 | 4/1980 | Uehara et al. ......................... | 357/40 |
| 4,513,307 | 4/1985 | Brown .................................. | 357/45 X |
| 4,656,732 | 4/1987 | Teng et al. .......................... | 357/71 X |

FOREIGN PATENT DOCUMENTS

| | | | |
|---|---|---|---|
| 0154346 | 4/1980 | European Pat. Off. .............. | 357/40 |
| 3423211 | 3/1981 | Fed. Rep. of Germany ........ | 357/40 |
| 58-64046 | 4/1983 | Japan ................................. | 357/45 M |
| 58-79736 | 5/1983 | Japan ................................. | 357/68 |
| 58-200556 | 11/1983 | Japan ................................. | 357/45 M |
| 59-135744 | 8/1984 | Japan ................................. | 357/45 M |
| 2122809 | 1/1984 | United Kingdom ............. | 357/45 M |

OTHER PUBLICATIONS

"Three-Layer Channel Routing", IEEE Trans. Computer Aided Des, vol. CAD-3, pp. 156-163, Y. K. Chen and M. L. Liu, Apr. 1984.
IBM Technical Disclosure Bulletin, vol. 26, No. 6, Nov. 1983, pp. 2842-2845, New York, US; L. B. Caldwell et al: "Optimum Wiring Connections for Single-Metal Level Integrated Circuits".
Saigo, T., Niwa, K., Ohto, T., Kurosawa, S., and Takada, T., "A Triple-Level Wired 24K-Gate CMOS Gate Array", The Journal of Solid-State Circuits, vol. SC-20, No. 5, Oct. 1985, pp. 1005-1010.

Primary Examiner—Andrew J. James
Assistant Examiner—Sara W. Crane
Attorney, Agent, or Firm—Oblon, Fisher, Spivak, McClelland & Maier

[57] ABSTRACT

Disclosed is an integrated semiconductor circuit device which has a plurality of cell arrays formed in parallel on a surface region of the substrate, and a three-layer wire formed on the substrate and between each cell array. The direction of a wire track of a second layer wire is originally determined in a direction parallel to the cell arrays, and the direction of wire tracks of first and third layer wires is originally determined in a direction orthogonal to the originally determined direction of the wire track of the second layer wire. The first layer wire and the third layer wire are formed on the same wire track. Part of the third layer wire is formed on a wire track orthogonal to the originally determined direction of the wire track of the third layer, and the third layer wire and the second layer wire are connected to each other on the wire track which is orthogonal to the originally determined direction of the wire track of the third layer wire.

15 Claims, 3 Drawing Sheets

INTEGRATED SEMICONDUCTOR CIRCUIT DEVICE

BACKGROUND OF THE INVENTION

The present invention relates to an integrated semiconductor circuit device having a multi-layer wire structure.

With an increase in degree of integration of the semiconductor circuit device, there has been a demand for integrating a logic circuit having complicated functions on one chip. The method of integrating includes the master slice method and the standard cell method.

The former is known as a method of making a gate array. This method is to previously make a large number of elements on a substrate and connect the elements through wires, thus to obtain a desired logic circuit. In this master slice method, the area and shape of the wire region are determined depending upon the degree of integration of the elements.

On the other hand, the standard cell method is to previously arrange in rows a large number of logic-circuit elements called "standard cells" and connect the cells through wires. In this method, the area and shape of the wire region are varied in accordance with the number of wiring tracks. That is, as the scale of a logic circuit is increased, the number of signals are increased. As a result, the number of wiring tracks is increased when the circuit device is laid out, so that the area of the wire region is increased to cause an increase in area of the entire chip. Thus, the degree of integration on the chip is decreased.

In order to solve this problem, the master slice method utilizes a three-layer wire structure, the wire being made of metal, while the standard cell method uses a three-layer wire structure including a polycrystalline-silicon wire, as the wire structure. However, where such a multi-layer wire structure is utilized, the following disadvantages are produced.

Generally, a large-scale integrated semiconductor circuit device is wired by not manually but in accordance with an automatic wiring method that is called "CAD" (computer aided design). For this reason, for facilitating the wiring operation, the wires are distributed only in the wire tracks formed beforehand in the wire region in the form of a matrix. In this case, only a specified wire track is used for each wire layer. Usually, where one of two adjacent wire layers uses a horizontal (lateral) wire track, the other thereof uses a vertical (vertical) wire track. When two wire layers are not adjacent to each other as in case of the first and third wire layers, there is a possibility that the wires of the two wire layers are overlapped one upon the other, since both wire layer use the same wire track. Thus, an additional wire track is required to connect the overlapped wires to each other. As a result, there arises a problem that the area of the wire region is not sufficiently reduced, or that the wire region becomes large in area to cause an increase in the wire resistance, so that the time of delaying the transmission of a signal becomes long.

As an example, reference will now be made to a prior art integrated semiconductor circuit device having a three-layer wire structure in which the first and third wire layers use a vertical track as their respective wire tracks; and the second wire layer uses a horizontal track as its wire track. FIG. 1 is a plan view of a prior art example wherein the first and third layer wires overlap each other, and their wires being connected to the second layer wire.

FIG. 2 is a sectional view taken along the line II—II' of FIG. 1. The first layer (the lowest layer) wire 2 is connected, at a connection position $C_1$, to the second layer wire 4 in a wire track orthogonal to that in which the first layer wire 2 is located. A third layer wire 8 which is overlapped upon the first layer wire 2 is connected, at a connection position $C_2$, to a second layer wire 6 in a wire track different from that in which the second layer wire 4 is located. In FIG. 2, the layer which is designated by a reference numeral 1 is a substrate while the layer which is designated by a reference numeral 9 is an insulation layer.

In this way, where the integrated semiconductor circuit device has a three-layer wire structure in which the first layer wire 2 and the third layer wire 8 are partially overlapped one upon the other and intersect the second layer wire at right angles, the connection positions in different wire tracks are required to connect the first and third layers wires to the second layer wire. This hinders the reduction in area of the wire region.

SUMMARY OF THE INVENTION

The object of the invention is to provide an integrated semiconductor circuit device having a multi-layer wire structure, which is capable of effecting the wire connection between two wire layers without requiring any additional wire track, thereby preventing the wire region from being increased, thus achieving a high degree of integration.

The above object can be achieved by an integrated semiconductor circuit device comprising a semiconductor substrate, a plurality of cell arrays formed in parallel on said substrate, a multi-layer wire formed on said substrate and between each cell array, the direction of a wire track of a second layer wire being originally determined in a direction parallel to the cell arrays, the direction of the wire tracks of first and third layer wires being originally determined in a direction orthogonal to the originally determined direction of the wire track of the second layer wire, and said first layer wire and said third layer wire overlapping one another, wherein part of said third layer wire is formed on a wire track orthogonal to the originally determined direction of the wire track of said third layer, or, alternatively, part of said second layer wire is formed on a wire track orthogonal to the originally determined direction of the wire track of said second layer wire, whereby said first layer wire and said second layer wire, or said second layer wire and said third layer wire are connected to each other on said wire track which is orthogonal to the originally determined direction of the wire track of said third layer wire or said second layer wire.

DETAILED DESCRIPTION OF THE PREFERRED EMBODIMENTS

Figure 1:
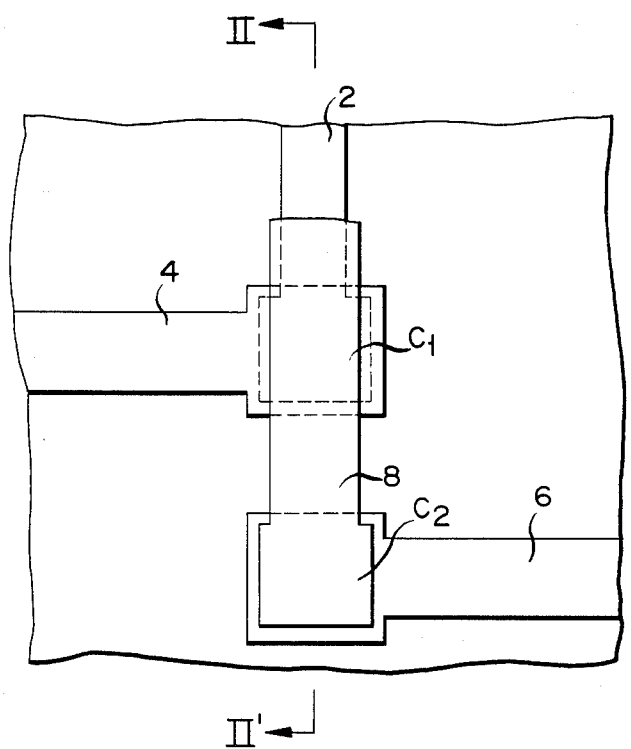
FIG. 1 is a plan view of a prior art example of an integrated semiconductor circuit device having a three-layer wire structure.
Figure 2:
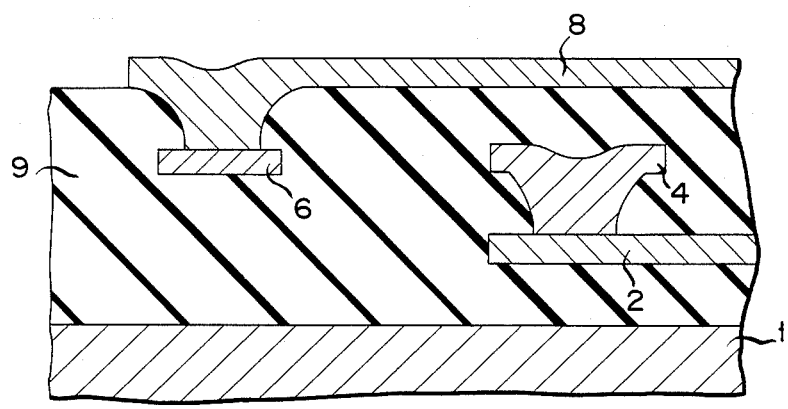
FIG. 2 is a sectional view of FIG. 1.
Figure 3:
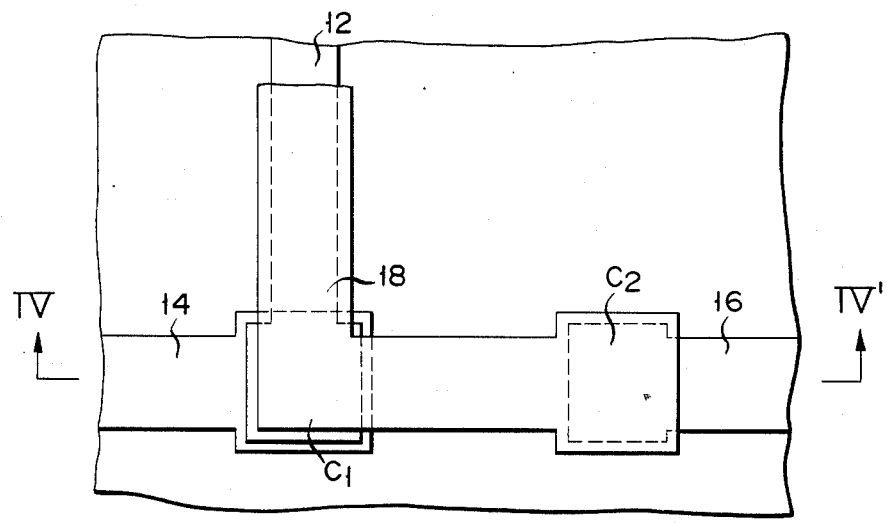
FIG. 3 is a plan view of an integrated semiconductor circuit device in accordance with a first embodiment of the invention.
Figure 4:
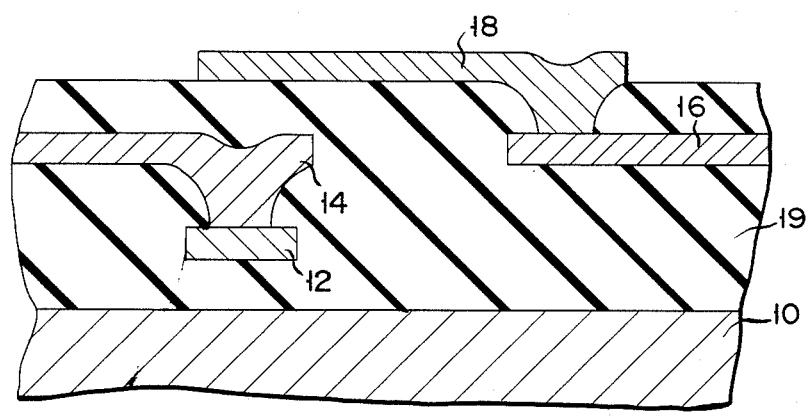
FIG. 4 is a sectional view of FIG. 3.

An integrated semiconductor circuit device in accordance with an embodiment of the invention will now be described with reference to the accompanying drawings. FIG. 3 is a plan view of an integrated semiconductor circuit device in accordance with a first embodiment of the invention, and FIG. 4 is a sectional view of FIG. 3. The reference numeral 10 is a silicon substrate on the surface region of which are formed in parallel a plurality of cell arrays. On the wire area between two adjacent cell arrays there are sequentially formed the first layer wire 12, the second layer wires 14, 16, and the third layer wire 18 in the order mentioned. The second layer wires 14 and 16 are formed on the same wire track. The layer which is designated by the reference numeral 19 is an insulation layer. The first layer wire 12 is made of polycrystalline silicon while the second layer wires 14 and 16 and the third layer wire 18 are made of metal such as, for example, aluminium.

The wire track which is originally determined for the second layer is a wire track which is parallel to the cell array. The original wire track for the first and third layers is a wire track which is orthogonal to the cell array, i.e., the wire track for the second layer. In this first embodiment, the first layer wire 12 and a part of the third layer wire 18 are overlapped upon each other. In order to connect the overlapped wires 12 and 18 to the second layer wire, the first layer wire 12 is connected, at a connection position $C_1$, to the second layer wire 14. Further, a part of the third wire 18 is bent in a direction orthogonal to the original wire track therefor, i.e., in a direction extending along the wire track for the second layer, and the third layer wire 18 is connected to the second layer wire 16 at a connection position $C_2$ located on the force end of the bent portion of the third layer wire 18.

In this way, according to the first embodiment, there is provided a multi-layer wire structure in which the first layer wire and the third layer wire are overlapped upon each other. In this structure, part of the third layer wire is bent in the direction orthogonal to the original wire track, i.e., in the direction extending along the wire track for the second layer. Thus, the third layer wire is connected, at that bent portion thereof, to the second layer wire, and the first layer wire is connected to the second layer wire in the original wire track for the first layer. For these reasons, the connection between the first and second layer wires as well as the connection between the third and second layer wires can be effected on the same wire track. Thus, it is possible to prevent the number of wire tracks from being increased when carrying out the wire connection between the wire layers of the multi-layer wire structure and, at the same time, to prevent the total length of the wires from being increased. Thus, it is possible to reduce the area of the chip involved.

Figure 5:
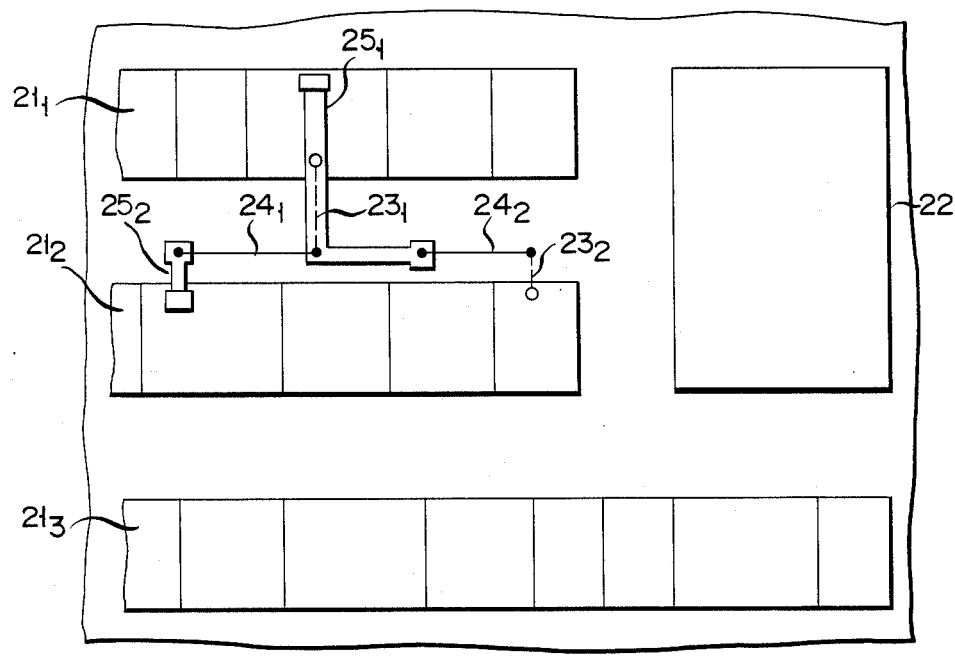
FIG. 5 is a plan view showing a detailed layout of an integrated logic circuit device which uses the wire structure in accordance with the first embodiment of the invention.

FIG. 5 is a plan view showing a detailed layout of an integrated logic circuit device using the wire structure in accordance with the first embodiment of the invention. Standard cell arrays $21_1$, $21_2$ and $21_3$ are arranged in parallel. In addition to the standard cell arrays, a functional block 22 is formed. FIG. 5 shows a wire pattern in the wire area between the standard cell arrays $21_1$ and $21_2$. In this wiring pattern, the wires $23_1$ and $23_2$ which are indicated by dotted lines are the first layer wires, the wires $24_1$ and $24_2$ which are indicated by solid lines are the second layer wires, and the wires $25_1$ and $25_2$ which are indicated by the lines having enlarged width are the third layer wires. The second layer wires $24_1$ and $24_2$ are arranged in the same wire track. The first layer wire $23_1$ is connected to the second layer wire $24_1$. The third layer wire $25_1$ which is overlapped upon the first layer wire $23_1$ is bent or curved in a direction extending along the wire track for the second layer. The third layer wire $25_1$ is connected to the second layer wire $24_2$ at the bent portion.

In this way, by bending a part of the third layer wire in a direction orthogonal to the original wire track thereof, the overlapped first and third layer wires can respectively be connected to the different second layer wires arranged in the same wire track.

Figure 6:
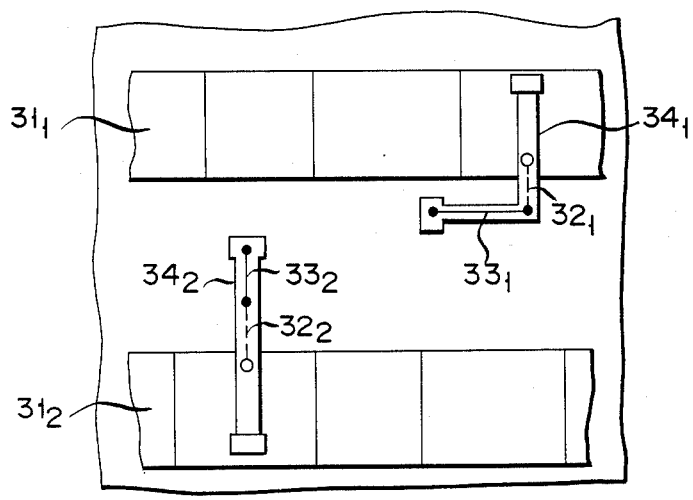
FIG. 6 is a plan view showing a detailed layout of an integrated logic circuit device which uses the wire structure in accordance with a second embodiment of the invention.

FIG. 6 is a plan view showing a detailed layout of an integrated logic circuit device based on the wiring structure in accordance with a second embodiment of the invention. Standard cell arrays $31_1$ and $31_2$ are arranged in parallel. The wires $32_1$ and $32_2$ which are indicated by dotted lines are the first layer wires. The wires $33_1$ and $33_2$ which are indicated by solid lines are the second layer wires. The wires $34_1$ and $34_2$ which are indicated by lines having enlarged width are the third layer wires. While FIG. 5 shows the wiring pattern for connecting the standard cell arrays $21_1$ and $21_2$ to each other. FIG. 6 shows a wiring pattern for connecting the first and third layer wires to each other in regard to the standard cell arrays $31_1$ and $31_2$.

In this connection, where the first layer wire and the third layer wire are overlapped one upon the other, the first layer wire and the third layer wire must respectively be connected to the second layer wires in different wire tracks, the second layer wires being connected to each other through a first or third layer wire, as explained in the descriptions of the prior art.

In the second embodiment, however, by bending a part of the third or second layer wire in a direction orthogonal to that of the original wire track therefor, the use of only one second layer wire makes it possible to connect the first layer wire to the third layer wire.

In case of the cell array $31_1$ of FIG. 6, the first layer wire $32_1$ and the third layer wire $34_1$ are overlapped one upon the other. The third layer wire $34_1$ is bent in the wire area in a direction extending along the original wire track for the second layer wire $33_1$. Thus, the connection between the first layer wire $32_1$ and the second layer wire $33_1$, as well as the connection between the second layer wire $33_1$ and the third layer wire $34_1$, is thereby effected on the second layer wire $33_1$. In case of the cell array $31_2$ as well, the first layer wire $32_2$ and the third layer wire $34_2$ are overlapped one upon the other. However, the second layer wire $33_2$ is arranged in a direction orthogonal to that of the original wire track thereof. By utilizing this manner of provision, the first layer wire $32_2$ and the third layer wire $34_2$ are connected to each other.

In accordance with the first embodiment as well, it is possible to reduce the number of additional wire tracks as compared with the prior art, according to the second embodiment.

The present invention is not limited to the above-mentioned embodiments but permits various modifications to be made. For example, although the above-mentioned embodiments have been described as ones applied to the integrated semiconductor circuit device having a three-layer wire structure, this invention can be also applicable to the integrated semiconductor circuit device having a four or more-layer wire structure. In this case, the same effect can be obtained only if three adjacent layers of those layers are structured in the same manner as in the above-mentioned embodiments.

As has been described above, according to the present invention, when the wiring in a multi-layer wire structure of the integrated semiconductor circuit device is performed in accordance with the computer aided design (CAD), a part of one of the two overlapping layer wires disposed in the same track is bent to a direction orthogonal to the original wire track therefor. Thus, by utilizing that bent portion, the connection between the overlapping wires in the two layers can be effected without requiring the use of any additional wire track. This prevents the wire region from increasing in area and, at the same time, enables the degree of integration to be increased.

What is claimed is:

1. An integrated semiconductor circuit device comprising:
   (a) a semiconductor substrate;
   (b) a plurality of cell arrays formed in parallel on said substrate;
   (c) wiring formed in at least first, second and third wiring layers on said substrate for connecting said cell arrays, each layer including wires arranged in predetermined parallel wire tracks,
   the direction of a wire track of a second layer wire being originally determined in a first direction parallel to the cell arrays,
   the direction of a wire track of first and third layer wires being originally determined in a second direction orthogonal to the first direction,
   said first layer wire and said third layer wire overlapping each other,
   one of said first layer wire and said overlapping third layer wire having a bent portion formed on a wire track orthogonal to the second direction, and
   said one of said first layer wire and said overlapping third layer wire at said bent portion, and the other of said first and third layer wires, connected to respective second layer wires on the same wire track of said first direction.

2. An integrated semiconductor circuit device comprising:
   (a) a semiconductor substrate;
   (b) a plurality of cell arrays formed in parallel on said substrate;
   (c) wiring formed in at least first, second and third wiring layers on said substrate for connecting said cell arrays, each layer including wires arranged in predetermined parallel wire tracks,
   the direction of a wire track of a second layer wire being originally determined in a first direction parallel to the cell arrays,
   the direction of a wire track of first and third layer wires being originally determined in a second direction orthogonal to the first direction,
   said first layer wire and said third layer wire overlapping each other,
   one of said first layer wire and said overlapping third layer wire having a bent portion formed on a wire track orthogonal to the second direction, and
   said one of said first layer wire and said overlapping third layer wire at said bent portion, and the other of said first and third layer wires, connected to each other through said second layer wire on a single track of said first direction.

3. An integrated semiconductor circuit device comprising:
   (a) a semiconductor substrate;
   (b) a plurality of cell arrays formed in parallel on said substrate;
   (c) wiring formed in at least first, second and third wiring layers on said substrate for connecting said cell arrays, each layer including wires arranged in predetermined parrallel wire tracks,
   the direction of a wire track of a second layer wire being originally determined in a first direction parallel to the cell arrays,
   the direction of a wire track of first and third layer wires being originally determined in a second direction orthogonal to the first direction,
   said first layer wire and said third layer wire overlapping each other,
   said second wiring layer including a second layer wire arranged orthogonal to said first direction, and
   said first layer wire and said overlapping third layer wire connected to each other through respective connections to different portions of said second layer wire arranged orthogonal to said first direction.

4. An integrated semiconductor circuit device according to claim 1, in which said wiring is formed between said cell arrays.

5. An integrated semiconductor circuit device according to claim 2, in which said wiring is formed between said cell arrays.

6. An integrated semiconductor circuit device according to claim 3, in which said wiring is formed between said cell arrays.

7. An integrated semiconductor circuit device according to claim 1, in which said first, second and third wiring layers are sequentially formed on said substrate.

8. An integrated semiconductor circuit device according to claim 2, in which said first, second and third wiring layers are sequentially formed on said substrate.

9. An integrated semiconductor circuit device according to claim 3, in which said first, second and third wiring layers are sequentially formed on said substrate.

10. An integrated semiconductor circuit device according to claim 1, in which said first layer is made of polycrystalline silicon and said second and third layers are made of aluminum.

11. An integrated semiconductor circuit device according to claim 2, in which said first layer is made of polycrystalline silicon and said second and third layers are made of aluminum.

12. An integrated semiconductor circuit device according to claim 3, in which said first layer is made of polycrystalline silicon and said second and third layers are made of aluminum.

13. An integrated circuit semiconductor circuit device according to claim 1, in which said cell arrays are standard cells.

14. An integrated circuit semiconductor circuit device according to claim 2, in which said cell arrays are standard cells.

15. An integrated semiconductor circuit device according to claim 3, in which said cell arrays are standard cells.

* * * * *

UNITED STATES PATENT AND TRADEMARK OFFICE
CERTIFICATE OF CORRECTION

PATENT NO. : 4,746,965
DATED : May 24, 1988
INVENTOR(S) : Hiroaki NISHI

It is certified that error appears in the above-identified patent and that said Letters Patent is hereby corrected as shown below: On the title page:

The city of location of the Assignee [73] is incorrect.
It should be corrected as follows:

-- Kawasaki, Japan --

Signed and Sealed this

Thirteenth Day of December, 1988

Attest:

DONALD J. QUIGG

Attesting Officer

Commissioner of Patents and Trademarks